United States Patent
Wu et al.

(10) Patent No.: US 10,912,206 B2
(45) Date of Patent: Feb. 2, 2021

(54) DISPLAY DEVICE

(71) Applicant: Qisda Corporation, Taoyuan (TW)

(72) Inventors: Feng-Yu Wu, Yilan (TW); Chih-Wei Tien, Taoyuan (TW); Wu-Shen Lin, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 16/707,677

(22) Filed: Dec. 9, 2019

(65) Prior Publication Data
US 2020/0196458 A1 Jun. 18, 2020

(30) Foreign Application Priority Data
Dec. 18, 2018 (CN) .......................... 2018 1 1547063

(51) Int. Cl.
*H05K 7/02* (2006.01)
*H05K 7/04* (2006.01)
*H05K 5/00* (2006.01)
*G02F 1/1333* (2006.01)
*H05K 5/02* (2006.01)

(52) U.S. Cl.
CPC ..... *H05K 5/0017* (2013.01); *G02F 1/133308* (2013.01); *H05K 5/0217* (2013.01)

(58) Field of Classification Search
USPC .................................................. 361/809, 755
See application file for complete search history.

(56) References Cited

U.S. PATENT DOCUMENTS

| 8,824,133 B2* | 9/2014 | Ko ........................ G06F 1/187 |
| | | 361/679.39 |
| 9,430,987 B2* | 8/2016 | Gomi .................... G06F 1/1601 |
| 2020/0240582 A1* | 7/2020 | Lin .......................... G02F 1/13 |

* cited by examiner

*Primary Examiner* — Hung S. Bui

(57) ABSTRACT

A display device including a display module and a calibration module is provided. The display module has a light exit surface. The calibration module includes a detecting component and a connecting component. The connecting component is configured to connect the detecting component and display module. The connecting component includes a connecting rod, a guiding rail and a rotating unit. The detecting component is disposed on one side of the connecting rod. The sliding rail has a guiding hole, and the connecting rod passes through the guiding hole. The rotating unit is connected to the other end of the connecting rod. When the rotating unit rotates, the connecting rod moves along the guiding hole between a first end and a second end of the guiding hole, so that the detecting component moves between a detection position and a stowed position. The detection position is located on the light exit surface.

20 Claims, 7 Drawing Sheets

DISPLAY DEVICE

BACKGROUND

Technical Field

The present invention relates to a display device. Particularly, the present invention relates to a display device with a calibration function.

Related Art

With the development of the electronic visual display such as Liquid-Crystal Display (LCD), Light-emitting Diode Display (LED Display), various flat panel displays have been popularized in the world nowadays.

For applications such as digital image design, digital post-production, etc., the color of the display device should be presented in a high quality and high accurate manner, so as to avoid the unacceptable deviation between the output image and the intended design image. Accordingly, the existing calibration devices have been developed to calibrate the image of the display device.

However, the above-mentioned external color calibration devices needs to be manually mounted and set to calibrate the display device. Thus, the color calibration device might not be capable of detecting the light emitted from the display device precisely if the color calibration device is placed in an erroneous position or in a deviated position. Further, the color calibration device might be affected by ambient light and therefore the function for calibrating the display device might be affected accordingly.

SUMMARY

The present invention provides a display device having a self-calibration function.

The display device of an embodiment of the present invention includes a display module and a calibration module. The display module has a light exit surface. The calibration module includes a detecting component and a connecting element. The connecting component is configured to connect the detecting component and the display module. The detecting component includes a connecting rod, a sliding rail and a rotating unit. The detecting component is disposed at one end of the connecting rod. The sliding rail has a guiding hole through which the connecting rod passes. The rotating unit is connected to the other end of the connecting rod. When the rotating unit rotates, the connecting rod moves along the guiding hole between a first end and a second end of the guiding hole, so that the detecting component moves between a detection position and a stowed position. The detection position is located on the light exit surface.

In an embodiment of the present invention, the above sliding rail substantially extends in a circumferential direction of the rotation that the rotating unit rotates.

In an embodiment of the present invention, at least a part of the above guiding hole is a curved guiding hole. When the connecting rod moves along the curved guiding hole, the distance between the detecting component and the light exit surface changes with movements of the connecting rod.

In an embodiment of the present invention, the above guiding hole includes at least a first area and at least a second area. The first area is adjacent to the light exit surface, and a first end is located in the first area. One side of the second area is connected to the first area. The connecting rod passes through the guiding hole, and the connecting rod moves between the first area and the second area as the rotating unit rotates. When the connecting rod reaches the first end in the first area, the detecting component is located at the detection position.

In an embodiment of the present invention, in the normal direction of the above light exit surface, the distance between the second area and the light exit surface is greater than the distance between the first area and the light exit surface.

In an embodiment of the present invention, the above guiding hole further includes a third area. The second end is located in the third area, and the second area is connected between the first area and the third area. The first radial direction is a direction in which the axle centre of rotation of the rotating unit is directed to the first area; and the second radial direction is a direction in which the axle centre of rotation of the rotating unit is directed to the third area. The display module provides image light for forming the image onto an image area from the light exit surface. The first radial direction is directed to the image area and the second radial direction is directed to outside of the image area. When the connecting rod reaches a second end in the third area, the detecting component is located at a stowed position.

In an embodiment of the present invention, the above guiding hole includes a plurality of curved guiding hole. These curved guiding holes construct a wavy line, and the distance between the detecting component and the light exit surface changes with the movement of the connecting rod.

In an embodiment of the present invention, the above display device further includes a frame. The frame covers the side of the display module that surrounds the light exit surface. The frame includes an inner surface and a visible surface. The rotating unit is disposed on the inner surface of the frame, and is adapted to rotate along a first axis. When the detecting component is at the stowed position, the detecting component is shielded by the visible surface.

In an embodiment of the present invention, the above connecting component further includes a worm and a push valve. The push valve is configured to push the worm so that the rotating unit rotates along the circumferential direction of the rotation. The rotating unit includes a worm wheel that is engaged with the worm. The push valve pushes the worm so as to rotate the rotating unit as the worm wheel rotates.

In an embodiment of the present invention, the above worm wheel includes a groove. The connecting rod is inserted into the groove in a radial direction in which the rotating unit rotates, and the groove is connected to the connecting rod via a rotating shaft. The rotating unit is adapted to rotate around a first axis, the rotating shaft is adapted to rotate around the first axis. The second axis is perpendicular to the first axis, and is perpendicular to a normal line of the light exit surface.

In an embodiment of the present invention, the above connecting component further includes a rotating shaft connected between the connecting rod and the rotating unit. The rotating unit is adapted to rotate along a first axis, the rotating shaft is adapted to rotate the connecting rod along a first axis. The second axis is perpendicular to the first axis, and is perpendicular to a normal line of the light exit surface.

In an embodiment of the present invention, the above connecting component further includes a flexible component connected between the connecting rod and the rotating unit.

In an embodiment of the present invention, on a virtual plane where the above light exit surface extends, the projection area of the connecting component is located outside of the arrangement area of the light exit surface.

The display device of the embodiment of the present invention includes a display module and a calibration module. The display module has a panel and a frame covering the sides of the panel. The calibration module is disposed at the sides of the panel. The calibration module includes a detecting component, a connecting rod, a sliding rail and a rotating unit. The detecting component is disposed at a first end of the connecting rod. The sliding rail is fixed to the frame. The sliding rail has a guiding hole through which the connecting rod passes. The rotating unit is disposed on the frame and adapted to rotate along an axle centre. The rotating unit is connected to a second end of the connecting rod. The rotating unit rotates such that the connecting rod moves the detecting component along the guiding hole. Thereby, the detecting component moves between the stowed position and a detection position. The detection position is located on the light exit surface, and the stowed position is covered by the frame.

In an embodiment of the present invention, the extending direction of the above guiding hole and the virtual plane where the panel extends are arranged in a non-parallel manner.

In an embodiment of the present invention, the above detecting component moves from the stowed position to the detection position in a manner of approaching the panel.

In an embodiment of the present invention, the above display device further includes a rotating shaft. The rotating shaft is connected between the connecting rod and the rotating unit. The rotating unit is adapted to rotate around a first axis, the rotating shaft is adapted to rotate the connecting rod around a first axis. The second axis is perpendicular to the first axis, and is perpendicular to the normal line of the virtual plane where the panel extends.

In an embodiment of the present invention, at least a part of the above guiding hole is a curved guiding hole. When the connecting rod moves along the curved guiding hole, a distance between the detecting component and the panel changes with movement of the connecting rod.

The display device of the embodiment of the present invention includes a panel, a frame and a calibration module. The panel has a light exit surface; the frame is configured to cover one side of the panel; the calibration module is disposed between the panel and the frame. The calibration module includes a detecting component, a connecting rod and a rotating unit. The detecting component is disposed at the first end of the connecting rod; the rotating unit is connected to the second end of the connecting rod. The rotating unit is disposed on the frame. The rotating unit rotates so that the detecting component moves from a stowed position to a detection position through a detour distant position. The detection position is located on the light exit surface, and the stowed position is covered by the frame. On a virtual plane where the light exit surface extends, the vertical distance between the detour distant position and the virtual plane is greater than the vertical distance between the detection position and the virtual plane and the vertical distance between the stowed position and the virtual plane.

In an embodiment of the present invention, the above calibration module further includes a sliding rail. The sliding rail is fixed to the frame and has a guiding hole. The connecting rod passes through the guiding hole, and the rotating unit rotates so that the detecting rod moves the detecting component along the guiding hole.

It can be seen from the above that in the display device provided by the present invention, the calibration module can move to reach the panel or the light exit surface of the display module so as to detect the display module via the detecting component, thereby providing a calibration function.

DETAILED DESCRIPTION

The present invention provides a display device that can display an image and calibrate the image by itself. For example, the display device can be a liquid crystal display device (LCD), a thin film transistor LCD (TFT-LCD), a light-emitting diode display, an organic light emitting diode display, or any other types of flat panel displays. The present invention is not limited to the types of the display technology to which the display device is applied. Those skilled in the art to which the present invention pertains can apply the technical solution provided by the present invention to any other display device that requires calibration for color or brightness of the image as needed.

Figure 1:
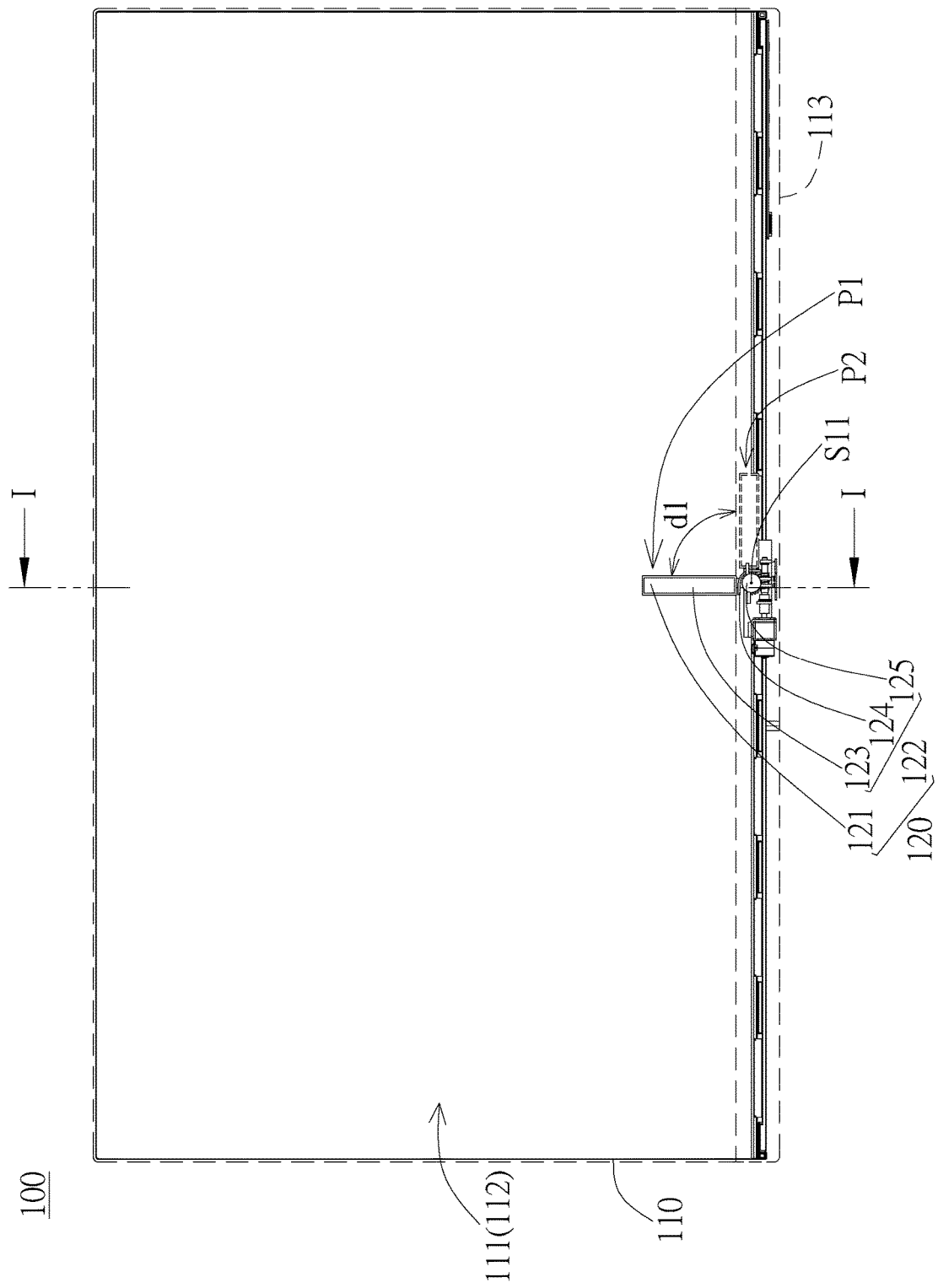
FIG. 1 is a schematic view of a display device according to an embodiment of the present invention.

FIG. 1 is a schematic view of a display device according to a first embodiment of the present invention, in which some components are illustrated in a see-through manner for clearly illustrating the display device of the present embodiment. However, the present invention is not limited thereto. Referring to FIG. 1, the display device 100 includes a display module 110 and a calibration module 120. In this embodiment, the display module 110 might be, for example, a TFT-LCD module having a light exit surface 111. The display module 110 provides a display image via the light exit surface 111, and the calibration module 120 can receive the light for forming the image on the light exit surface 111 so as to perform a calibration function.

The calibration module 120 includes a detecting component 121 and a connecting component 122. The detecting component 121 is disposed at one end of the connecting component 122, and the detecting component 121 includes photosensitive components such as a Charged-coupled device (CCD) and a complementary Metal-Oxide-Semiconductor (CMOS) sensor, so as to convert an optical image from the light exit surface 111 into an electronic signal for calibrating.

The connecting component 122 is configured to connect the detecting component 121 to the display module 110. In the present embodiment, the connecting component 122 includes a connecting rod 123, a sliding rail 124, and a rotating unit 125. The detecting component 121 is disposed at one end of the connecting rod 123. Therefore, the connecting rod 123 is adapted to move the detecting component 121, such that the detecting component 121 can reach a position where the light exit surface 111 can be detected. The sliding rail 124 has a guiding hole (not shown in FIG. 1), and the connecting rod 123 passes through the guiding hole of the sliding rail 124, so that the guiding hole can guide the movement of the connecting rod 123. Thereby, the detecting component 121 can move to an appropriate position to detect the light exit surface 111.

For the sake of clarity, "axle centre" is used to represent the position of the centre of the rotating, and "axis" is used to represent the rotating axis extending from the position of the centre in the following specification. These terms are only used to describe similar elements and concepts, and are not used to distinguish or limit the present invention in any aspect. In the present embodiment, the connecting rod 123 is connected between the detecting component 121 and the rotating unit 125. The rotating unit 125 is adapted to drive the connecting rod 123, and the detecting component 121 rotates around the axle centre S11 and the sliding rail 124 is adapted to guide the moving path of the connecting rod 123, so that the connecting rod 123 can move along the circumferential direction d1. In this embodiment, when the connecting rod 123 moves between the two ends of the guiding hole of the sliding rail 124, the connecting rod 123 and the detecting component 121 can move between the stowed position P2 and the detection position P1 along the direction d1. The detecting component 121 at the detection position P1 is located on the light exit surface 111, so as to effectively detect the light exit surface 111.

In other aspects, in the present embodiment, the display module 110 substantially includes the panel 112 and the frame 113. The light exit surface 111 is provided by the panel 112, and the frame 113 can cover the side of the panel 112. The calibration module 120 is disposed on the side of the panel 112 between the frame 113 and the panel 112. The sliding rail 124 and the rotating unit 125 are disposed at the frame 113. Therefore, when the detecting component 121 is located at the stowed position P2, the detecting component 121 can be covered by the frame 113. Preferably, the calibration module 120 can be covered by the frame 113, thereby achieving a better stowed status.

As can be seen from the above, the display device 100 provided by the first embodiment of the present invention can perform calibration on the light exit surface 111 of the display module 110 via the calibration module 120. The calibration module 120 can move to a suitable detection position on the light exit surface 111 by itself, so as to detect the light exit surface 111. Also, if needed, the calibration module 120 can move to a stowed position so that the user do not see the calibration module 120 at viewable area, thereby providing a better usage experience.

The sliding rail 124 of the present invention is not limited to extending along the circumferential direction d1 with respect to the axle centre S11 as described in the above embodiment (that is, the circumferential direction d1 that an object rotates around the axle centre S11). In other embodiments, the extension path of the sliding rail 124 can be also changed along the radial direction with respect to the axle centre S11. A person skilled in the art can adjust the extension path of the sliding rail 124 timely according to the rotation mode and the requirements of the mechanism and the space. Thus, the present invention is not limited thereto.

Figure 2A:
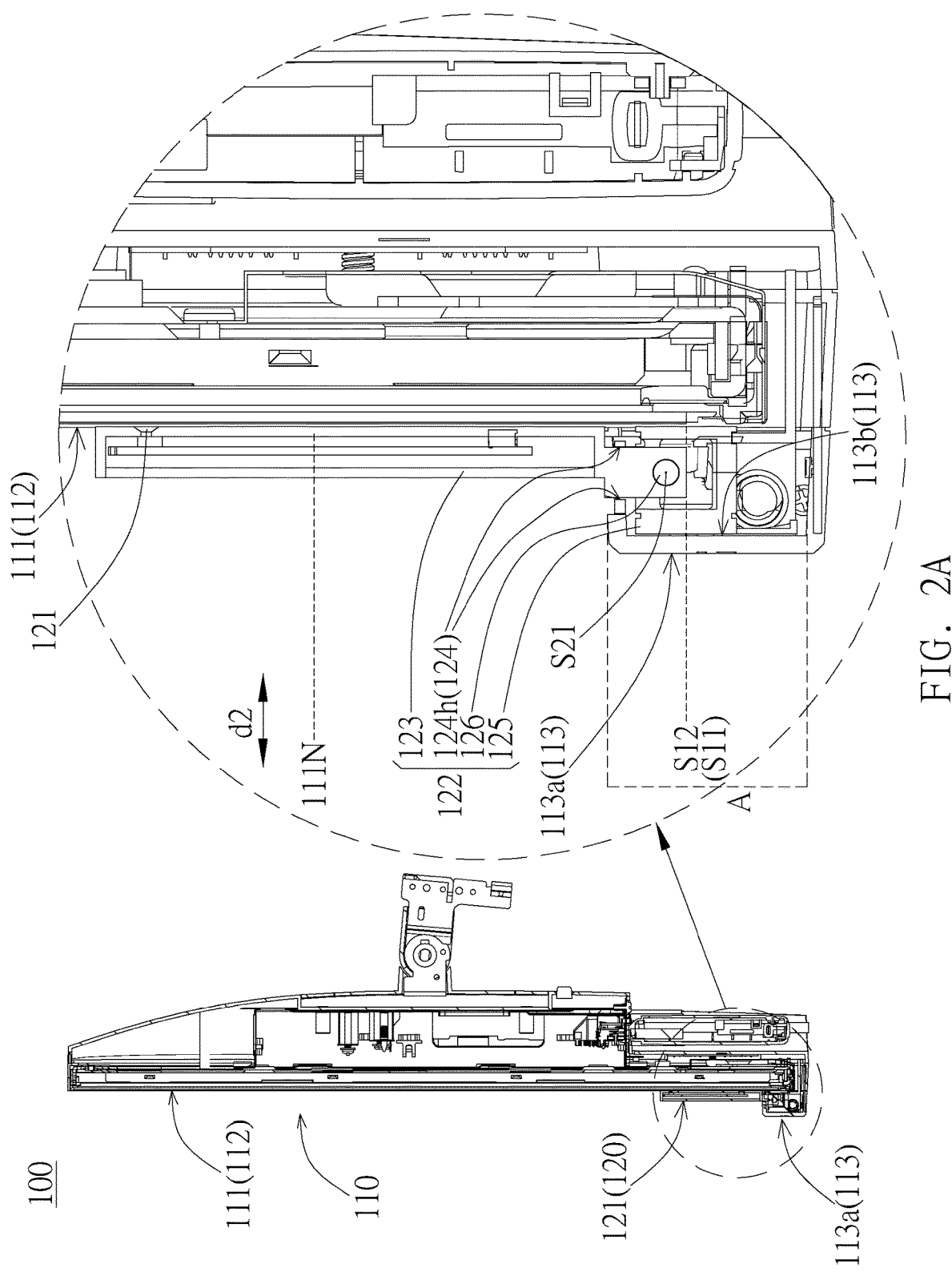
FIG. 2A and FIG. 2B are respectively a schematic cross-sectional view taken along the section line I in FIG. 1 and a partial enlarged view of a connecting component in FIG. 1.

In detail, FIG. 2A is a schematic cross-sectional view and a partially enlarged cross-sectional view taken along a section line I of FIG. 1. Referring to FIG. 2A, in the display module 110 of the display device 100 of the present embodiment, the panel 112 provides a light exit surface 111. Here, the light exit surface 111 is substantially a portion of the surface of the panel 112 that is not covered by the frame 113. The frame 113 can further shield at least a part of the calibration module 120 when the detecting component 121 is at the stowed position.

In detail, referring to the enlarged view of FIG. 2A, when the detecting component 121 of the present embodiment is located at the stowed position, the visible surface 113a of the frame 113 can shield the detecting component 121. The calibration module 120 can rotate around the axis S12 (that is, the above axle centre S11) to move the detecting component 121 to the area A, so that the visible surface 113a can shield the detecting component 121. In other words, on a virtual plane in which the light exit surface 111 of the present embodiment extends, the projection area of the connecting component 122 is located outside of the arrangement area of the light exit surface 111 (that is, the area A in FIG. 2A).

In other aspects, the frame 113 of the present embodiment can also fix the position of the calibration module 120. The rotating unit 125 can be disposed on the inner surface 113b of the frame 113, so that the detecting component 121 and the connecting rod 123 can move with respect to the light exit surface 111 of the panel 112 when the detecting component 121 and the connecting rod 123 move around the axis S12.

In the present embodiment, the sliding rail 124 includes a guiding hole 124h, preferably a curved guiding hole 124h (which will be described later in other drawings). When the connecting rod 123 moves along the curved guiding hole 124h, the distance between the detecting component 121 and the light exit surface 111 can be changed with the movement of the connecting rod. Specifically, the detecting component 111 substantially detects the light emitted by the light exit surface 111 along a direction d2, and the direction d2 is substantially parallel or nearly parallel to the normal line 111N of the light exit surface 111. In this direction d2, the distance between the detecting component 121 and the light exit surface 111 is changed when the connecting rod 123 moves along the guiding hole 124h. In other words, the detecting component 121 can be moved from the stowed position to the detection position in a manner of approaching the panel 112 (that is, the position depicted in FIG. 2A).

Specifically, in the present embodiment, the connecting component 122 further includes a rotating shaft 126 connected between the connecting rod 123 and the rotating unit 125. Referring to FIG. 2A, in the present embodiment, the rotating unit 125 is adapted to rotate around the axis S12, and the rotating shaft 126 is adapted to rotate the connecting rod 123 around the axle centre S21. The axis of rotation of the rotating shaft 126 around the axle centre S21 is perpendicular to the axis S12, and is perpendicular to the normal line 111N of the light exit surface 111.

Figure 2B:
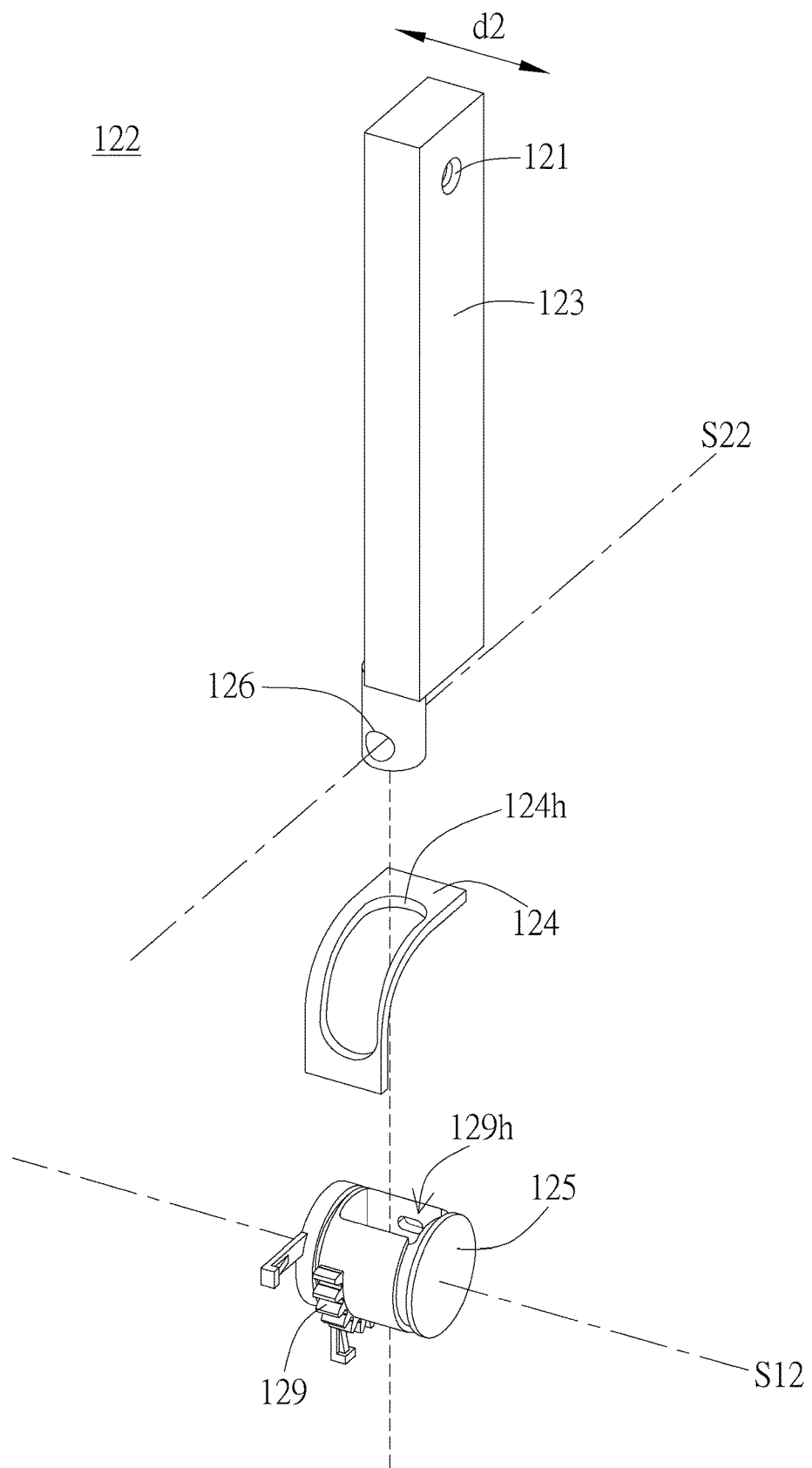

Further, please refer to the schematic exploded view of the connecting component 122 depicted in FIG. 2B, the connecting rod 123 disposed with the detecting component 121 can be disposed on the rotating unit 125 via the guiding hole 124h of the sliding rail 124. The connecting rod 123 and the rotating unit 125 of the present embodiment are connected via the rotating shaft 126, therefore the connecting rod 123 can be rotated around the axis S12 with respect to the rotating unit 125. As a result, when the rotating unit 125 rotates around the axis S12, the sliding rail 124 can drive the connecting rod 123 to rotate with the rotating shaft 126 around the axis S12, thereby changing the distance between the detecting component 121 and the light exit surface 111 by the rotation based on the rotating shaft 126. Specifically, for example, the rotating unit 125 of the present embodiment can be implemented by a worm wheel 129. Further, in some other embodiments, preferably, the distance in direction d2 can also be changed. Hereinafter, other components will be further described below, but the present invention is not limited thereto.

In other embodiments of the present invention, the connection between the rotating unit 125 and the connecting rod 123 is not limited to the above-mentioned rotating shaft 126. In other embodiments, it might be a flexible component suitable for bending, such as a connecting rod made of a flexible material. For example, a rubber or a spring. When the rotating unit 125 rotates the connecting rod 123, the movement limitation of the position of the connecting rod 123 along the guiding hole 124 can be compensated with the change of the distance between the detecting component 121 and the light exit surface 111 by flexing via the flexible material.

Figure 3:
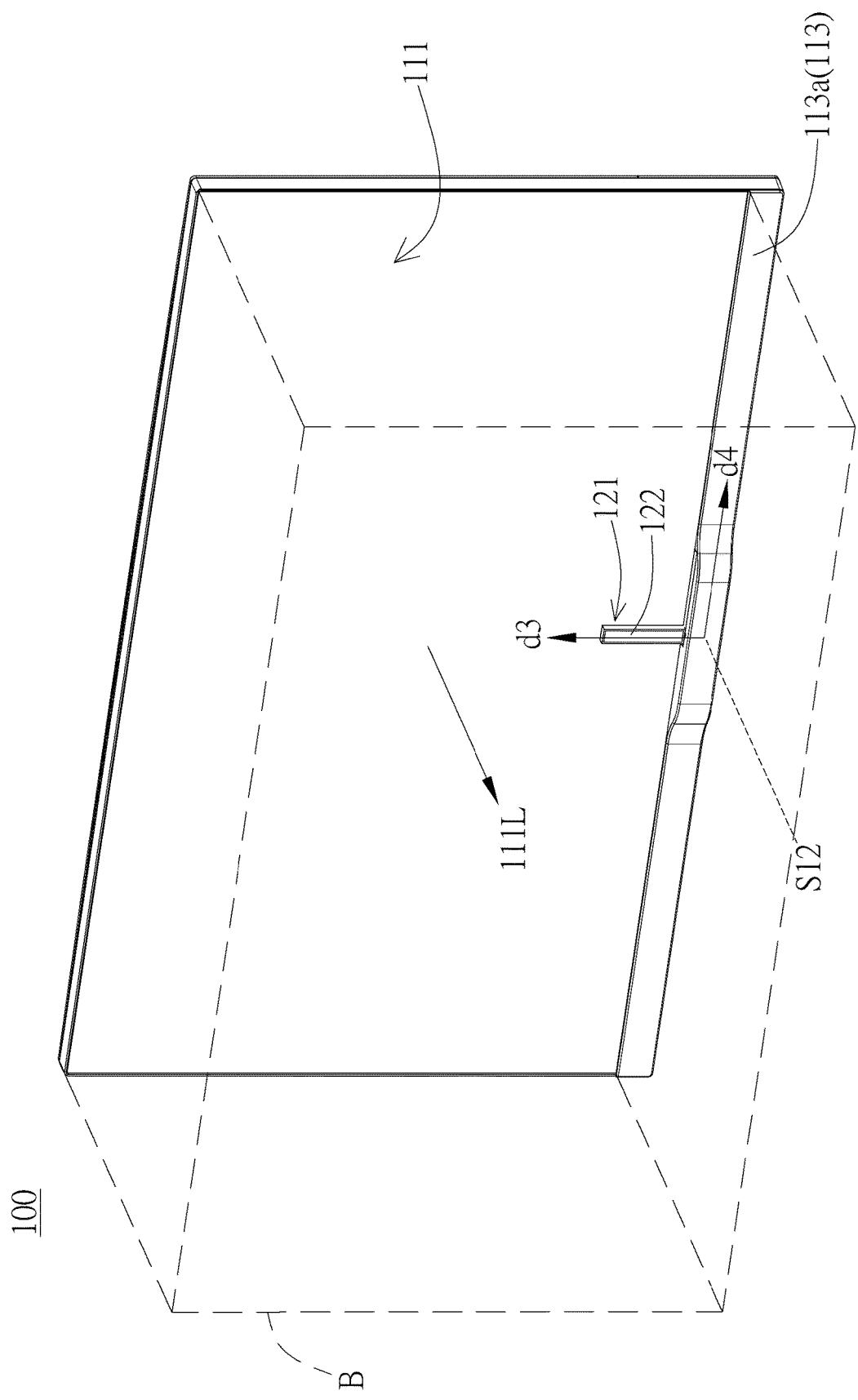
FIG. 3 is a perspective view of a display device according to an embodiment of the present invention.

Hereinafter, the display area of the display device 100 according to the first embodiment described above will be further described. Referring to the perspective view of FIG. 3, the display light exit surface 111 of the display device 100 substantially emits image light 111L onto the image area B. When the detecting component 121 moves to the detection position (i.e., the position depicted in FIG. 3), the connecting component 122 extends substantially along the first radial direction d3 toward the image area B. When the detecting component 121 moves to the stowed position, the connecting component 122 extends substantially along a second radial direction d4 that is directed to outside of the image area B. In this embodiment, the calibration module 120 can rotate the connecting component 122 to move the detecting component 121 into the image area B or outside the image area B. The above sliding rail 124 can be used to control the distance between the detection component 121 and the light exit surface 111, so as to provide a better image detection function by the calibration module 120, thereby providing effective calibration.

Figure 4A:
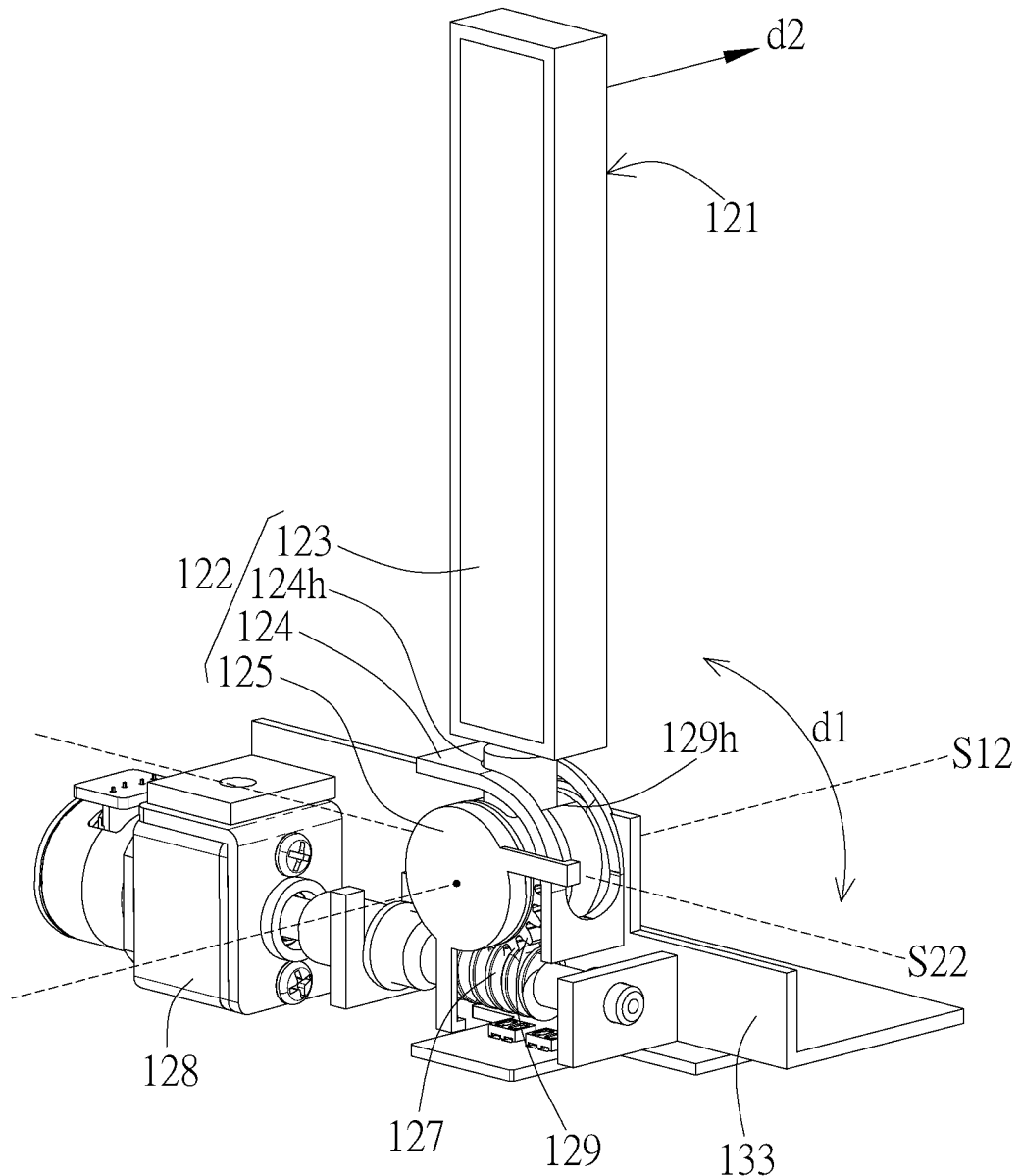
FIG. 4A is a perspective view of a calibration module according to an embodiment of the present invention.

The calibration module of the embodiment of the present invention will be further described below. Referring to the perspective view of the calibration module 120 in FIG. 4A, the connecting component 122 further includes a worm 127 and a push valve 128, and the rotating unit 125 includes a worm wheel 129. The worm wheel 129 meshes with the worm 127, and the push valve 128 pushes the worm 127 to rotate the rotating unit 125 through the worm wheel 129. The push valve 128 can, for example, move or rotate the worm 127 to drive the worm wheel 129, and the present invention is not limited thereto.

Further, the rotating unit 125 of the present embodiment is substantially formed by the worm wheel 129, and the worm wheel 129 further includes a groove 129h. The connecting rod 123 is inserted into the groove 129h along the radial direction of the rotation of the rotating unit 125 (that is, the direction pointing to the axis S12). The groove 129h and the connecting rod 123 are connected or fixed by the rotating shaft 126 described above, so that the connecting rod 123 can drive the detection component 121 to rotate around the axis S12 (or in some embodiments, the axes S12 and S22). The rotating unit 125 can drive the rotation around the axis S12, and the above rotating shaft 126 can drive the rotation of the connecting rod 123 around the axis S12. However, the present invention is not limited to the case that the connecting rod 123 and the rotating unit 125 are connected with a rotating shaft, and in other embodiments, the connecting rod 123 and the rotating unit 125 can be connected with a flexible component, in which the flexible component can further swing substantially around the axis S22.

Figure 4B:
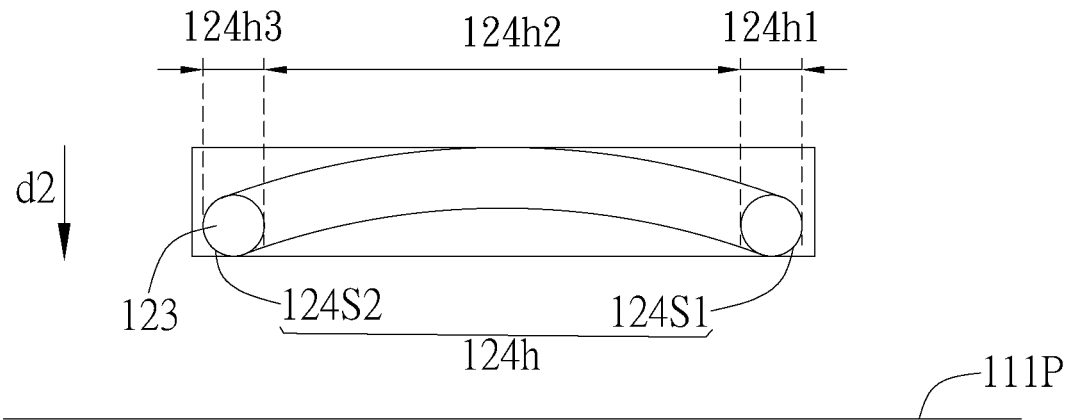
FIG. 4B is a schematic view of a sliding rail according to an embodiment of the present invention.

Hereinafter, the display device provided in other embodiments of the present invention will be described in detail with a simplified schematic view of the sliding rail and the guiding hole. The schematic view of the planar arrangement is used to exemplarily illustrate the shape of the sliding rail, but the shape of the sliding rail is not limited thereto. Referring to the schematic view of the sliding rail 124 of the first embodiment in FIG. 4B, the connecting rod 123 can pass through the guiding hole 124h. The guiding hole 124h allows the connecting rod 123 to move between the first end 124S1 and the second end 124S2. Taking the extending plane 111P of the light exit surface of the panel as an example, the distance between the first end 124S1 and the plane 111P is closer than the other portions of the guiding hole 124h. Thus, when the connecting rod 123 moves to the first end 124S 1, the above detecting component 121 is also moved to the detection position, such that the distance between the detecting component at the detection position and the light exit surface can also be reduced by approaching toward the direction d2 through the guiding hole 124h, thereby providing a more accurate detection effect.

In the present embodiment, by the guiding of the guiding hole 124h, the detecting component described above can be moved from a stowed position to a detection position through a detour distant position. The vertical distance between the stowed position and the plane 111P is smaller, thereby reducing the frame thickness of the display device. Specifically, the guiding hole 124h of the embodiment is a curved guiding hole 124h. When the connecting rod 123 moves along the curved guiding hole 124h, the distance between the detecting component described above and the light exit surface changes with the movement of the connecting rod. In the present embodiment, the guiding hole 124h includes a first area 124h1 and a second area 124h2. The guiding hole 124h at the first area 124h1 is adjacent to the light exit surface (that is, the extending plane 111P). The first end 124S1 is located in the first area 124h1, and one side of the second area 124h2 is connected to the first area 124h1. In the normal direction d2 of the light exit surface (that is, the extending plane 111P), the distance between the guiding hole 124h and the light exit surface 111 at the second area 124h2 is larger, and the distance between the guiding hole 124h and the light exit surface 111 at the first area 124h1 is smaller. In other words, the extending direction of the guiding hole 124h is substantially arranged with the virtual extending plane 111P where the panel extends in a non-parallel manner. When the connecting rod 123 of the present embodiment is located at the first area 124h1, the detecting component on the connecting rod 123 is located at the detection position; and when the connecting rod 123 is located at the second area 124h2, the detecting component on the connecting rod 123 is located at a detour distant position. Therefore, the vertical distance between the detour distant position and the virtual extending plane 111P of the light exit surface 111 is greater than the vertical distance between the detection position and the virtual extending plane 111P of the light exit surface 111.

In the embodiment, the guiding hole 124h further includes a third area 124h3. The second end 124S2 is located in the third area 124h3, and the second area 124h2 is connected between the first area 124h1 and the third area 124h3.

Therefore, when the connecting rod 123 is located at the third area 124h3, the detecting component 121 can be located at the stowed position. Specifically, the distance between the second end 124S2 and the extending plane 111P is shorter, so that the connecting rod 123 can move the detecting component to a suitable stowed position. Meanwhile, since the distance between the detour distant position and the extending plane 111P is greater than the distance between the stowed position and the extending plane 111P, the thickness of the area of the frame for accommodating the detecting component can be reduced, thereby achieving a thinning effect of the display device.

In other aspects, the above first radial direction is the direction in which the axle centre of rotation of the rotating unit is directed to the first area 124h1, so that the connecting component 123 can be directed to the image area when passing through the first area 124h1. The second radial direction is the direction in which the axle centre of rotation of the rotating unit is directed to the third area 124h3, so that the connecting component 123 passing through the third area 124h3 can be directed to outside of the image area.

Figure 4C:
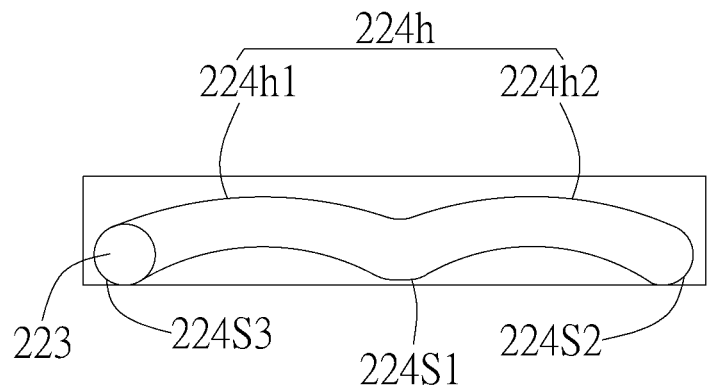
FIG. 4C is a schematic view of a sliding rail according to an embodiment of the present invention.

The present invention is not limited to the above-described guiding holes 124h. Please refer to the schematic view of the sliding rail 224 depicted in FIG. 4C. In other embodiments of the present invention, the guiding hole 224h of the sliding rail 224 is substantially constructed with a plurality of curved guiding holes 224h1, 224h2 so as to form the guiding hole 224h extending along a wavy line. The distance between the detecting component and the light exit surface can be changed when the connecting rod 223 moves along the guiding hole 224h. Specifically, when the connecting rod 223 is located at the first end 224S1, the detecting component on the connecting rod 223 can move to a first detection position; when the connecting rod 223 is located at the second end 224S2, the detecting component on the connecting rod 223 can move to a second detection position. Both two positions are positions approaching near the light exit surface through the guiding hole 224h, and therefore a better detection effect can be provided. In other aspects, when the connecting rod 223 is located at the third end 224S3, the connecting rod 223 can move the detecting component to the stowed position, thereby providing a better accommodation effect.

In an embodiment of the present invention, the extending direction of the guiding hole is arranged with the virtual plane where the panel extends in a non-parallel manner. In other words, the panel of the display module extends along the virtual plane, and the extending direction of the guiding hole is substantially not perpendicular to the normal vector of the virtual plane. Specifically, the guiding hole may extend in a non-linear manner, for example, in an arc or wavy path. Thus, the extending direction of the guiding hole may be substantially varied with position, and is not limited to extending in a single direction. Further, in some embodiments, when the guiding hole extends in a single direction, said single direction might be not perpendicular to the normal vector of the virtual plane.

Figure 5A:
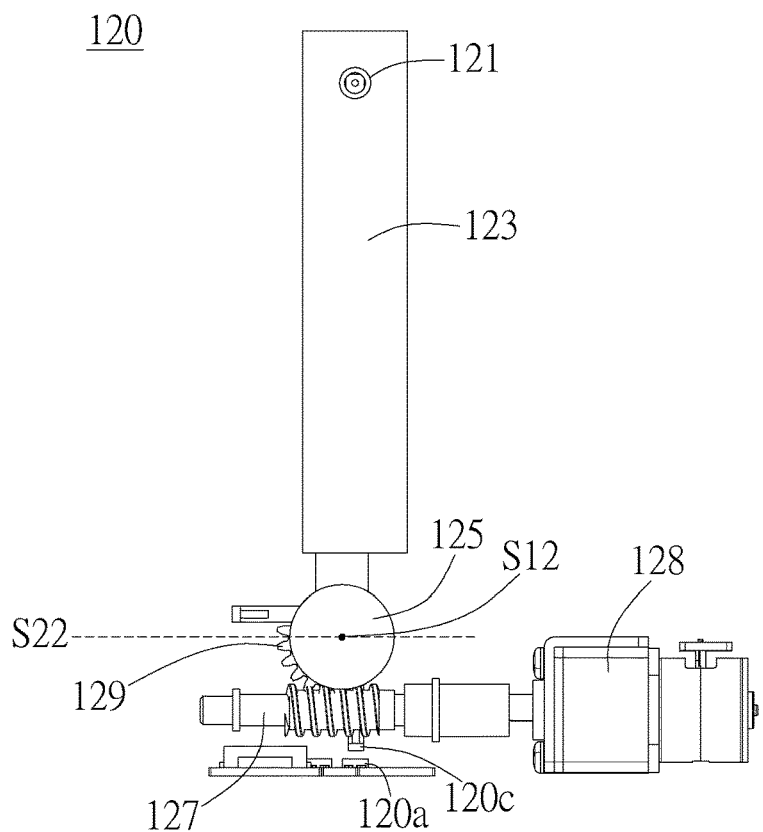
FIG. 5A is a schematic view of a calibration module that a detecting component is located at a detection position according to an embodiment of the present invention.

Hereinafter, an operation method of the calibration module of the embodiment of the present invention will be further exemplified and illustrated. Referring to the schematic view of the detecting component 121 of the calibration module 120 at the detection position depicted in FIG. 5A, the detecting component 121 is located at the connecting rod 123 and therefore connected to the rotating unit 125. The push valve 128 is coupled to the worm 127, and the worm 127 is engaged with the worm wheel 129. The push valve 128 of the present embodiment is exemplified by the method of rotating the worm 127. The rotation of the worm 127 can rotate the rotating unit 125, thereby allowing the detecting component 121 to reach the detection position. The calibration module 120 can further include a position detecting component 120a and a label 120c. The label 120c moves with the rotating unit 125. When label 120c moves to the detection position of the position detecting component 120a, the position detecting component 120a can transmit a signal to inform that the detecting component 121 reaches the detection position, thereby achieving an automatic adjustment effect.

Figure 5B:
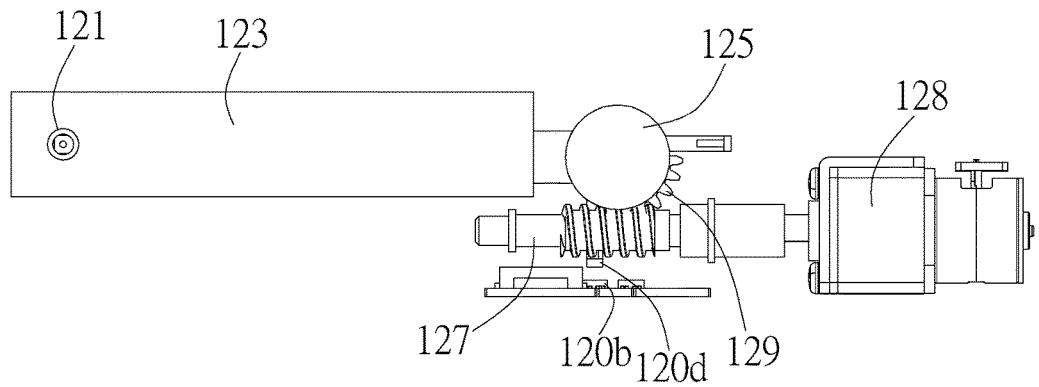
FIG. 5B is a schematic view of a calibration module that a detecting component is located at a stowed position according to an embodiment of the present invention.

Please refer to the schematic view of the calibration module 120 depicted in FIG. 5B at the stowed position. As stated above, by rotating the worm 127 via the push valve 128, the worm wheel 129 of the rotating unit 125 is driven so that the connecting rod 123 drives the detecting component 121 to reach the stowed position, and the rotating unit 125 is further connected to another label 120d for another position detecting component 120b to detect. Therefore, it can provide signal notification when the detecting component 121 reaches the detection position.

During the above movement, the connecting rod 123 can be rotated or swung around the axis S12 and/or the axis S22 by the above rotating shaft or the drive of the flexible component and the sliding rail. The detailed implementations can be found in the above contents, and will not be repeated here.

In sum, the display device provided by the present invention can perform detection and calibration on the light exit surface of the display module by the calibration module, and the calibration module can be set at a suitable detection position via the guidance of the sliding rail, thereby providing a more accurate and better calibration function.

The foregoing descriptions are merely some preferable embodiments of the present invention. It should be noted that, various changes or modifications can be made to the present invention without departing from the spirit and principle of the present invention. A person of ordinary skill in the art should understand that, the present invention is defined by the appended claims. In addition, under the intention of the present invention, any possible variation such as replacement, combination, modification, and diversion shall not exceed the scope defined by the appended claims of the present invention.

LIST OF REFERENCE NUMERALS

A Area
B Image area
d1, d2 Direction
d3 First radial direction
d4 Second radial direction
P1 Detection position
P2 Stowed position
S11, S21 Axle centre
S12, S22 Axis
100 Display device
110 Display module
111 Light exit surface
111L Image light
111N Normal line
111P Extending plane
112 Panel
113 Frame
113a Visible surface
113b Inner surface
120 Calibration module 120a, 120b Position detecting component
120c, 120d Label
121 Detecting component
122 Connecting component
123, 223 Connecting rod
124, 224 Sliding rail
124h, 224h Guiding hole
124h1 First area
124h2 Second area
124h3 Third area
124S1, 224S1 First end
124S2, 224S2 Second end
125 Rotating unit
126 Rotating shaft
127 Worm
128 Push valve
129 Worm wheel
129h Groove
224h1, 224h2 Curved guiding holes
224S3 Third end

What is claimed is:

1. A display device, comprising:
a display module having a light exit surface; and
a calibration module, comprising:
 a detecting component; and
 a connecting component configured to connect the detecting component and the display module, wherein the connecting component, comprising:
  a connecting rod, wherein the detecting component is disposed on one end of the connecting rod;
  a sliding rail having a guiding hole, wherein the connecting rod passes through the guiding hole; and
  a rotating unit connected to the other end of the connecting rod,
wherein when the rotating unit rotates, the connecting rod moves along the guiding hole between a first end and a second end of the guiding hole, so that the detecting component moves between a detection position and a stowed position, and
wherein the detection position is located on the light exit surface.

2. The display device according to claim 1, wherein the sliding rail substantially extends along a circumferential direction that the rotating unit rotates.

3. The display device according to claim 1, wherein at least a part of the guiding hole is a curved guiding hole, and
when the connecting rod moves along the curved guiding hole, a distance between the detecting component and the light exit surface changes with movement of the connecting rod.

4. The display device according to claim 1, wherein the guiding hole includes:
at least a first area adjacent to the light exit surface, wherein the first end is located in the first area; and
at least a second area, wherein one side of the second area is connected to the first area,
wherein the connecting rod passes through the guiding hole, and the connecting rod moves between the first area and the second area as the rotating unit rotates, and
wherein when the connecting rod reaches the first end in the first area, the detecting component is located at the detection location.

5. The display device according to claim 4, wherein in a normal direction of the light exit surface, a distance between the second area and the light exit surface is greater than a distance between the first area and the light exit surface.

6. The display device according to claim 4, wherein the guiding hole further includes:
a third area, wherein the second end is located in the third area, and the second area is connected to the first area and the third area;
wherein:
a first radial direction is a direction in which an axle centre of rotation of the rotating unit is directed to the first area;
a second radial direction is a direction in which the axle centre of rotation of the rotating unit is directed to the third area;
the display module provides image light for forming an image from the light exit surface to an image area, the first radial direction is directed to the image area, and the second radial direction is directed to outside of the image area;
when the connecting rod reaches the second end in the third area, the detecting component is located at the stowed position.

7. The display device according to claim 1, wherein the guiding hole includes a plurality of curved guiding holes, and the curved guiding holes construct a wavy line, and a distance between the detecting component and the light exit surface changes with movement of the connecting rod.

8. The display device according to claim 1, further comprising:
a frame covering at least a side of the light exit surface, wherein the frame includes an inner surface and a visible surface;
wherein:
the rotating unit is disposed on the inner surface of the frame and adapted to rotate around a first axis, and
when the detecting component is located at the stowed position, the detecting component is shielded by the visible surface.

9. The display device according to claim 1, wherein the connecting component further includes:
a worm; and
a push valve configured to push the worm,
the rotating unit includes a worm wheel, wherein the worm wheel meshes with the worm, and the push valve pushes the worm to rotate the rotating unit through the worm wheel.

10. The display device according to claim 9, wherein the worm wheel includes a groove, the connecting rod is inserted into the groove along a radial direction of the rotation of the rotating unit, and the groove and the connecting rod are connected via a rotating shaft; and
wherein the rotating unit is adapted to rotate around a first axis, and the rotating shaft is adapted to rotate around the first axis.

11. The display device according to claim 1, wherein the connecting component further includes a rotating shaft connected between the connecting rod and the rotating unit,
wherein:
the rotating unit is adapted to rotate around a first axis;
the rotating shaft is adapted to rotate the connecting rod around the first axis.

12. The display device according to claim 1, wherein the connecting component further includes a flexible component connected between the connecting rod and the rotating unit.

13. The display device according to claim 1, wherein on a virtual plane where the light exit surface extends, a projection area of the connecting component is located outside of an arrangement area of the light exit surface.

14. A display device, comprising:
a display module having a panel;
a frame configured to cover one side of the panel; and
a calibration module disposed on the side of the panel, the calibration module, comprising:
   a detecting component;
   a connecting rod, wherein the detecting component is disposed at a first end of the connecting rod;
   a sliding rail fixed to the frame, wherein the sliding rail has a guiding hole through which the connecting rod passes; and
   a rotating unit disposed on the frame and adapted to rotate around an axis, wherein the rotating unit is connected to a second end of the connecting rod,
   wherein the rotating unit rotates so that the connecting rod moves the detecting component along the guiding hole, thereby moving the detecting component between a stowed position and a detection position, and
   wherein the detection position is located on the panel, and the stowed position is covered by the frame.

15. The display device according to claim 14,
wherein an extending direction of the guiding hole and a virtual plane where the panel extends are arranged in a non-parallel manner.

16. The display device according to claim 14, wherein the detecting component moves from the stowed position to the detection position in a manner of approaching the panel.

17. The display device according to claim 14, further comprising:
   a rotating shaft connected between the connecting rod and the rotating unit;
   wherein the rotating unit is adapted to rotate around a first axis, the rotating shaft is adapted to rotate the connecting rod around the first axis.

18. The display device according to claim 14, wherein at least a part of the guiding hole is a curved guiding hole, when the connecting rod moves along the curved guiding hole, a distance between the detecting component and the panel changes with movement of the connecting rod.

19. A display device, comprising:
a panel having a light exit surface;
a frame configured to cover one side of the panel; and
a calibration module disposed between the panel and the frame, the calibration module includes:
   a detecting component;
   a connecting rod, wherein the detecting component is disposed at a first end of the connecting rod; and
   a rotating unit disposed on the frame, wherein the rotating unit is connected to a second end of the connecting rod,
   wherein the rotating unit rotates so that the detecting component moves from a stowed position to a detection position through a detour distant position, the detection position is located on the light exit surface, and the stowed position is covered by the frame,
   wherein on a virtual plane where the light exit surface extends, a vertical distance between the detour distant position and the virtual plane is greater than a vertical distance between the detection position and the virtual plane and a vertical distance between the stowed position and the virtual plane.

20. The display device according to claim 19, wherein the calibration module further includes:
   a sliding rail fixed on the frame, wherein the sliding rail has a guiding hole, the connecting rod passes through the guiding hole, and the rotating unit rotates so that the connecting rod moves the detecting component along the guiding hole.

* * * * *